United States Patent
Pohl et al.

(10) Patent No.: US 9,442,145 B2
(45) Date of Patent: Sep. 13, 2016

(54) CAPACITIVE SENSOR FOR A VEHICLE

(71) Applicant: BROSE FAHRZEUGTEILE GMBH & CO. KG, HALLSTADT, Hallstadt (DE)

(72) Inventors: Florian Pohl, Ebersdorf (DE); Holger Wuerstlein, Zeil am Main (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 44 days.

(21) Appl. No.: 14/482,113

(22) Filed: Sep. 10, 2014

(65) Prior Publication Data
US 2015/0070033 A1 Mar. 12, 2015

(30) Foreign Application Priority Data

Sep. 10, 2013 (DE) .................. 10 2013 014 824

(51) Int. Cl.
| | |
|---|---|
| *H03K 17/955* | (2006.01) |
| *G01R 27/26* | (2006.01) |
| *G01V 3/00* | (2006.01) |
| *G01V 3/08* | (2006.01) |

(52) U.S. Cl.
CPC ............ *G01R 27/2605* (2013.01); *G01V 3/00* (2013.01); *G01V 3/088* (2013.01); *H03K 17/955* (2013.01); *H03K 2217/960705* (2013.01); *H03K 2217/960765* (2013.01)

(58) Field of Classification Search
USPC .......... 324/663, 658, 679, 686, 207.13, 326, 324/537, 647, 654, 671, 174; 455/115.1, 455/556.1, 67.14, 73; 701/36, 1, 34.4, 45, 701/49; 73/862.68; 345/174
See application file for complete search history.

(56) References Cited

U.S. PATENT DOCUMENTS

| | | | |
|---|---|---|---|
| 6,066,954 A | 5/2000 | Gershenfeld et al. | |
| 6,664,661 B1 * | 12/2003 | Palata ................. | H03K 17/955 307/112 |
| 8,184,013 B2 | 5/2012 | Hammerschmidt | |
| 2004/0015058 A1 * | 1/2004 | Besson ............. | A61B 5/14552 600/301 |
| 2010/0060471 A1 * | 3/2010 | Hammerschmidt ........... | B60R 21/01532 340/657 |

(Continued)

FOREIGN PATENT DOCUMENTS

| | | |
|---|---|---|
| DE | 102009038923 A1 | 5/2010 |
| EP | 0896678 B1 | 2/2003 |

*Primary Examiner* — Melissa Koval
*Assistant Examiner* — Nasima Monsur
(74) *Attorney, Agent, or Firm* — Laurence A. Greenberg; Werner H. Stemer; Ralph E. Locher

(57) ABSTRACT

A capacitive sensor for a vehicle includes an evaluation unit as well as a first transmission electrode and a second transmission electrode for transmitting a respectively associated first measurement signal and second measurement signal. The two transmission electrodes are connected to a respective first and second transmitter output of the evaluation unit through an assigned first and second transmission line respectively. The evaluation unit alternately outputs the first measurement signal via the first transmitter output and the second measurement signal via the second transmitter output. The evaluation unit also connects the respective non-transmitting second or first transmitter output to reference potential. Alternatively, a common transmission electrode may output the measurement signal which is then picked up by first and second receiver electrodes.

5 Claims, 3 Drawing Sheets

(56) References Cited

U.S. PATENT DOCUMENTS

2010/0060489 A1* 3/2010 Fasshauer ............ H03K 17/955
  341/20
2010/0125269 A1* 5/2010 Emmons ............ A61B 18/1815
  606/33
2011/0133756 A1* 6/2011 Reime .................. H03K 17/955
  324/658

* cited by examiner

CAPACITIVE SENSOR FOR A VEHICLE

CROSS-REFERENCE TO RELATED APPLICATION

This application claims the priority, under 35 U.S.C. §119, of German patent application No. 10 2013 014 824.3, filed Sep. 10, 2013; the prior application is herewith incorporated by reference in its entirety.

BACKGROUND OF THE INVENTION

Field of the Invention

The invention relates to a capacitive sensor for a vehicle. The sensor is configured, in particular, to detect when an object approaches the sensor by way of two transmission electrodes that are separate from one another.

In modern vehicles, in particular in automobiles, capacitive sensors are often used to monitor, for example, the adjustment of electromotively driven vehicle parts as part of anti-trap protection. In that case, the adjustment distance region in front of the vehicle part is monitored for the presence of an obstacle using the capacitive sensors. In this case, such a capacitive sensor is preferably operated according to the so-called transmitter/receiver principle. That is to say, a measurement signal in the form of an electrical alternating field is output via a sensor electrode (referred to as the transmission electrode below). The alternating field is in turn received using a further sensor electrode (referred to as the receiver electrode below). The transmission electrode and the receiver electrode therefore form a sensor capacitor with a sensor capacitance that is determined using the measurement signal. An obstacle within the electrical alternating field results in this case in an abnormal change in the detected sensor capacitance, in response to which a control unit assigned to the anti-trap protection stops and possibly reverses the adjustment of the vehicle part (that is to say reverses the adjustment direction).

In order to also be able to detect comparatively small obstacles or objects, for example a vehicle occupant's finger, as precisely as possible and, in particular, in good time, the entire surface of the sensor capacitor is often formed by a plurality of small transmission electrodes. Although the respective sensor capacitance is smaller as a result, the presence of a small object is reflected in this case in a comparatively large capacitance change. In order to prevent the measurement signal output by a transmission electrode being electromagnetically coupled over to an adjacent transmission electrode, in particular its signal line, which in turn results in distortion of the respective measurement result, all sensor electrodes are conventionally connected to the associated evaluation unit of the sensor by way of a shielded line (i.e., usually a coaxial cable).

SUMMARY OF THE INVENTION

It is accordingly an object of the invention to provide a capacitive sensor assembly for a vehicle which overcomes the disadvantages of the heretofore-known devices of this general type and which provides for a functionally reliable capacitive sensor assembly.

With the above objects in view there is provided, in accordance with the invention, a capacitive sensor for a vehicle, comprising:

an evaluation unit with a first transmitter output and a second transmitter output;

a first transmission electrode for transmitting a first measurement signal, the first transmission electrode being connected to the first transmitter output of the evaluation unit by way of a first transmission line; and a second transmission electrode for transmitting a second measurement signal, the second transmission electrode being connected to the second transmitter output of the evaluation unit by way of a second transmission line;

the evaluation unit being configured to alternately output the first measurement signal via the first transmitter output and the second measurement signal via the second transmitter output, and to connect the respective non-transmitting second transmitter output or first transmitter output to reference potential.

According to the invention, the capacitive sensor comprises an evaluation unit and a first transmission electrode for transmitting a first measurement signal. In this case, the first transmission electrode is connected to a first transmitter output of the evaluation unit by way of a first transmission line. The evaluation unit also comprises a second transmission electrode for transmitting a second measurement signal, the second transmission electrode being connected to a second transmitter output of the evaluation unit by means of a second transmission line. In this case, the evaluation unit is set up to alternately output the first measurement signal via the first transmitter output and the second measurement signal via the second transmitter output. According to the invention, the evaluation unit is also set up to connect the respective non-transmitting transmitter output to reference potential. In other words, the second transmitter output is connected to reference potential while the first measurement signal is output via the first transmitter output and vice versa.

As a result of the fact that the respective inactive (that is to say non-transmitting) transmitter output is connected to reference potential (preferably to ground potential), the situation is advantageously achieved in which the measurement signal output via the active (that is to say transmitting) transmitter output is not influenced or is only negligibly influenced by electromagnetic coupling between the first and second transmission lines. A particularly high signal quality of the respective measurement signal is therefore achieved, as a result of which the functional reliability is in turn increased, that is to say the detection of particularly small objects in the measurement range of the sensor is improved, in particular.

Within the scope of the invention, it is conceivable in this case for the evaluation unit to have a first output driver and a second output driver which are respectively assigned to the first transmitter output and to the second transmitter output. The first and second output drivers are set up, in particular, to alternately regulate the first transmitter output or the second transmitter output to a predefined, fixed reference potential. Alternatively, the evaluation unit respectively has, in particular, a first switch assigned to the first transmitter output and a second switch assigned to the second transmitter output, which switch can be used to reversibly connect the respective transmitter output to reference potential.

In principle, it is conceivable, within the scope of the invention, for the evaluation unit of the capacitive sensor to determine a capacitance value with respect to ground, that is to say with respect to a closest grounded object in the environment of the sensor, using the respective transmission electrode. In a preferred embodiment, however, the capacitive sensor comprises a receiver electrode for receiving both the first measurement signal and the second measurement signal. The receiver electrode therefore forms a sensor capacitor with the respective active transmission electrode.

In this case, the evaluation unit of the sensor is preferably set up to respectively determine a capacitance measurement variable, which is characteristic of the sensor capacitance associated with the respective sensor capacitor (which therefore directly or indirectly represents the sensor capacitance, for example a displacement current), or the respective sensor capacitance itself using the respective measurement signal. The receiver electrode is connected to a receiver input of the evaluation unit, in particular by means of a shielded receiver line. In this case, the shielded receiver line prevents the first or second measurement signal (or possibly another source of electromagnetic interference) being coupled over to the receiver line and therefore resulting in a deterioration in the signal quality.

In accordance with an added feature of the invention, which represents an embodiment that is simple and cost-effective in terms of production, both the first transmission line and the second transmission line are in the form of an unshielded, in particular single-core, line. As a result, the complexity when laying the respective transmission line is also reduced since there is no need for electrical coupling of an external conductor (referred to as "shielding conductor" below) surrounding the respective transmission line to a (reference) potential connection. In particular, the two unshielded transmission lines can also be laid directly beside one another since a deterioration in the signal quality is effectively prevented by connecting the respective inactive transmission electrode to reference potential.

In accordance with an alternative feature of the invention, a common shielded line, in particular a coaxial cable, is provided for the purpose of transmitting the first and second measurement signals. In this case, the internal conductor of the shielded line is preferably in the form of a first signal line and the shielding conductor of the same shielded line is preferably in the form of a second transmission line. The first and second transmission electrodes are therefore coupled to the respective transmitter output by means of a single shielded line (in particular the coaxial cable), with the result that the installation complexity when laying the transmission lines is advantageously reduced.

In order to also save material and installation complexity, the first and second transmission electrodes are each formed as part of the respective transmission line itself, in particular by an end section at the free end, in an expedient embodiment. In this case, "free end" is understood as meaning that end of the (first or second) transmission line which faces away from the respective transmitter output.

In particular, if the first and second transmission lines are formed by the internal conductor and the shielding conductor of the same shielded line, the internal conductor of the shielded line is preferably uncovered from the shielding conductor in an end region at the free end. The first measurement signal can be emitted transversely with respect to the longitudinal direction, in particular radially with respect to the internal conductor, via this uncovered end region of the internal conductor. The uncovered end region of the internal conductor therefore forms the first transmission electrode itself. In this case, the second transmission electrode is preferably formed by a region (or: section) of the shielding conductor which adjoins the uncovered end region of the internal conductor. This embodiment is particularly advantageous in terms of installation since, during installation of the capacitive sensor, the shielded line is preferably shortened to a predefined overall length and the internal conductor is then uncovered from the shielding conductor only by an (electrode) length which is again predefined, without an additional electrode having to be electrically connected to the internal conductor and to the shielding conductor in each case.

In order to increase the surface area of the internal conductor which is effective for emitting the first measurement signal, the shielding conductor is interrupted between the evaluation unit and the free end of the shielded line in an advantageous, alternative embodiment. That end piece of the shielding conductor which is thus separated from the second transmitter output (that is to say that section which is electrically disconnected from the second transmitter output) is preferably in contact with the internal conductor in this case, with the result that the first transmission electrode is formed by the separated end piece of the shielding conductor. In this case, the separated end piece of the shielding conductor has, in particular, an electrode length which is predefined for the first transmission electrode, from the free end of the shielded line. In a similar manner to the embodiment described above, the second transmission electrode is formed by that section of the shielding conductor (at the free end) which is connected to the second transmitter output and adjoins the separated end piece.

With the above and other objects in view there is also provided, in accordance with an alternative embodiment of the invention, a capacitive sensor, comprising:
an evaluation unit having a first receiver input and a second receiver input;
a transmission electrode for emitting a measurement signal;
a first receiver electrode connected to the first receiver input of the evaluation unit by way of a first receiver line; and
a second receiver electrode connected to the second receiver input of the evaluation unit by way of a second receiver line;
the evaluation unit being configured to alternately receive the measurement signal via the first receiver input and via the second receiver input, and to connect the respectively inactive second receiver input or first receiver input to reference potential.

With regard to this alternative implementation of the inventive concept, the same effect according to the invention is also achieved by this alternative variant of the invention. In this case, the function of the two transmission electrodes is swapped with the receiver electrode. In other words, the capacitive sensor comprises, according to the invention, an individual transmission electrode for transmitting a measurement signal and a first and a second receiver electrode for alternately receiving the measurement signal. The respective inactive receiver electrode (in particular its associated receiver input), that is to say the receiver electrode which is not intended to receive the measurement signal, is connected to reference potential in this case.

In this case, the transmission electrode is preferably connected to the evaluation unit by means of a shielded line, whereas the two receiver electrodes are connected to the respective receiver inputs of the evaluation unit in a similar manner to the above-described embodiments for the first and second transmission electrodes. The two receiver electrodes are therefore connected to the evaluation unit by means of a respective unshielded (receiver) line or by means of a common shielded line, the first receiver electrode being connected via the internal conductor and the second receiver electrode being connected via the shielding conductor in the latter case.

The capacitive sensor is preferably intended to be used as a distance sensor in an anti-trap protection apparatus (anti-trap protection for short). In particular, the sensor is intended to be used in this case on a tailgate (also: trunk door or trunk lid), the first and second transmission electrodes preferably being arranged in a distributed manner in the longitudinal direction along a side edge of the tailgate. Alternatively, however, the sensor can also be used, within the scope of the invention, to contactlessly detect a door opening wish using a movement of the vehicle user.

Other features which are considered as characteristic for the invention are set forth in the appended claims.

Although the invention is illustrated and described herein as embodied in a capacitive sensor for a vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

Mutually corresponding parts and variables are always provided with the same reference symbols in all figures.

DETAILED DESCRIPTION OF THE INVENTION

Figure 1:
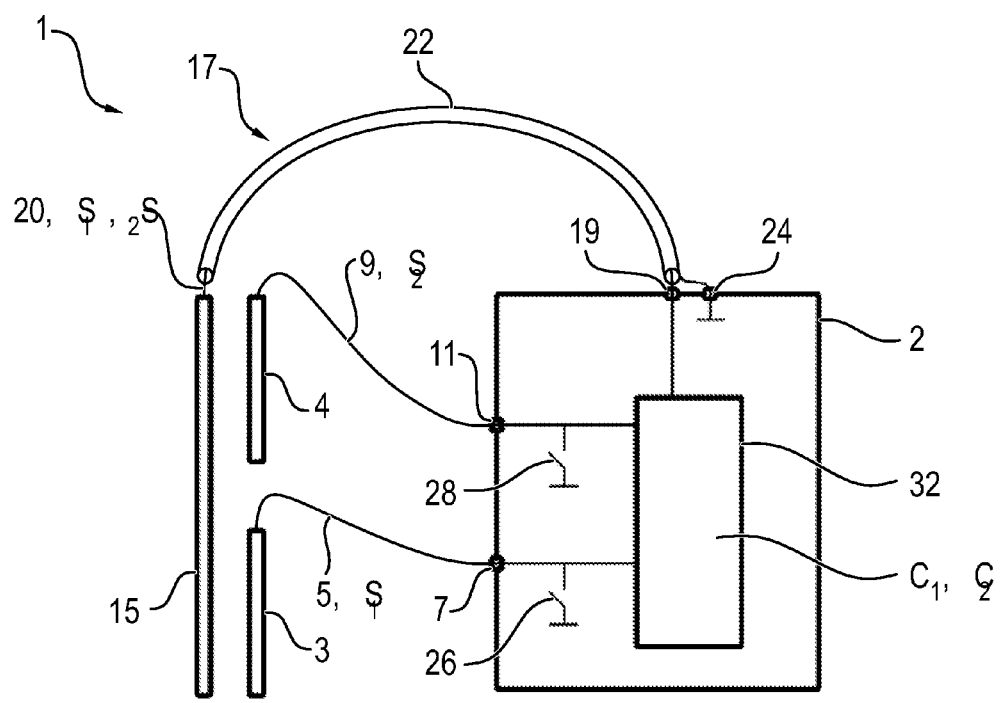
FIG. 1 schematically illustrates a capacitive sensor having an evaluation unit, a receiver electrode and two transmission electrodes which are separate from one another.

Referring now to the figures of the drawing in detail and first, particularly, to FIG. 1 thereof, there is shown a capacitive sensor 1 for a vehicle. The sensor is intended to be used within an anti-trap protection system for an adjustable vehicle part. The capacitive sensor 1 comprises an evaluation unit 2 as well as a first transmission electrode 3 and a second transmission electrode 4. The first transmission electrode 3 is connected to a first transmitter output 7 of the evaluation unit 2 by way of a first transmission line 5. The second transmission electrode 4 is accordingly connected to a second transmitter output 11 of the evaluation unit 2 via a second transmission line 9. The evaluation unit 2 is set up to output a first measurement signal $S_1$ via the first transmitter output 7 and therefore via the first transmission line 5 and the first transmission electrode 3. The evaluation unit 2 is also set up to output a second measurement signal $S_2$ alternately with the first measurement signal $S_1$ via the second transmitter output 11. That is to say, the evaluation unit 2 alternately outputs either the first measurement signal $S_1$ or the second measurement signal $S_2$.

In order to receive the first measurement signal $S_1$ and the second measurement signal $S_2$, the sensor 1 comprises a receiver electrode 15 (common to both transmission electrodes 3 and 4). The receiver electrode 15 is connected to a receiver input 19 of the evaluation unit 2 by way of a shielded receiver line 17 which is in the form of a coaxial cable with an internal conductor 20 and an external conductor (also: shielding conductor 22) surrounding the latter. In this case, the receiver electrode 15 is electrically coupled to the receiver input 19 by means of the internal conductor 20 of the receiver line 17. The shielding conductor 22 of the receiver line 17 is connected to a potential connection 24 of the evaluation unit 2 and is thereby electrically connected to reference potential. Within the scope of the invention, it is also alternatively conceivable for the shielding conductor 22 to be connected to a potential-controlled connection, with the result that the shielding conductor 22 forms a potential-controlled shield for the internal conductor 20 ("driven shield"). The shielding conductor 22 therefore prevents the first or second measurement signal $S_1$ or $S_2$ routed via the internal conductor 20 from being influenced, for example, by electromagnetic coupling-over of an adjacent electrical line.

Figure 2:
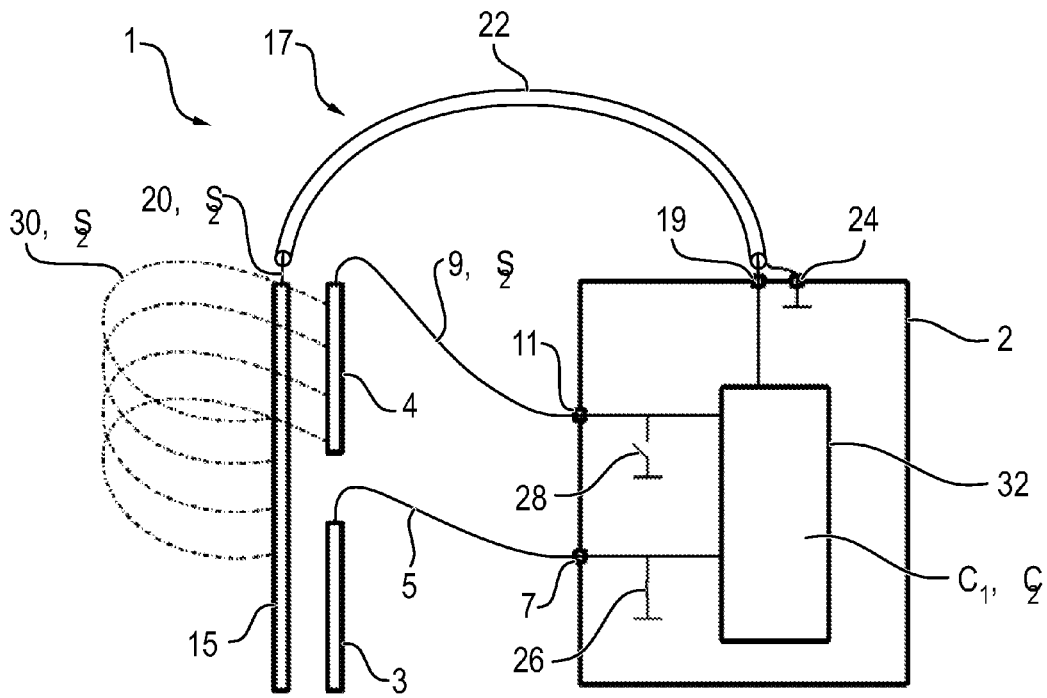
FIG. 2 shows the sensor in FIG. 1 in a view according to FIG. 1, a measurement signal being output via one of the transmission electrodes.

The evaluation unit 2 is also configured, in terms of circuitry, to alternately connect the first transmitter output 7 and the second transmitter output 11 to reference potential if the respective measurement signal $S_2$ or $S_1$ is output via the respective other transmitter output 11 or 7. In other words, the evaluation unit 2 connects the first transmitter output 7 to reference potential if the second measurement signal $S_2$ is output via the second transmitter output 11 (and accordingly vice versa). For this purpose, the evaluation unit 2 comprises a first switch 26 which is assigned to the first transmitter output 7 and is connected to reference potential, and a second switch 28 which is assigned to the second transmitter output 11 and is likewise connected to reference potential. As schematically illustrated in FIG. 2, the evaluation unit 2 then closes the first switch 26 if the second measurement signal $S_2$ is output via the second transmitter output 11, with the result that the first transmission line 5 (and therefore also the first transmission electrode 3) is connected to reference potential. In this case, the second measurement signal $S_2$ is emitted by the second transmission electrode 4 in the form of an electrical alternating field 30 (indicated by dot-dashed field lines) and is received by the receiver electrode 15. A corresponding situation applies to the first measurement signal $S_1$ (cf. FIG. 3). The respective transmitting transmission electrode 3 or 4 therefore respectively forms a first and a second sensor capacitor together with the receiver electrode 15.

A first sensor capacitance $C_1$ associated with the first transmission electrode 3 (or the first sensor capacitor) and a second sensor capacitance $C_2$ associated with the second transmission electrode 4 (or the second sensor capacitor) are respectively determined by the evaluation unit 2, specifically by a signal processing unit 32 subordinate to the latter, using the first or second measurement signal $S_1$ or $S_2$ received via the receiver input 19. Within the scope of anti-trap protection, it is possible to determine, on the basis of a change in the sensor capacitance $C_1$ or $C_2$, whether an object is approaching the vehicle part carrying the two transmission electrodes 3 and 4 and/or the receiver electrode 15. The presence of an object within the electrical alternating field 30 regularly results in this case in a reduction in the currently determined sensor capacitance $C_1$ or $C_2$.

As a result of the fact that the first transmitter output 7 is connected to reference potential via the switch 26, interaction of the first transmission electrode 3 and the first transmission line 5 with the second transmission line 9 and/or the second transmission electrode 4 is prevented. It is therefore possible for the first and second transmission lines 5 and 9 to each be in the form of unshielded lines, as illustrated in FIGS. 1 and 2, and for the signal quality nevertheless to be sufficiently high to detect very small objects (for example a child's finger) within the electrical alternating field 30.

Figure 3:
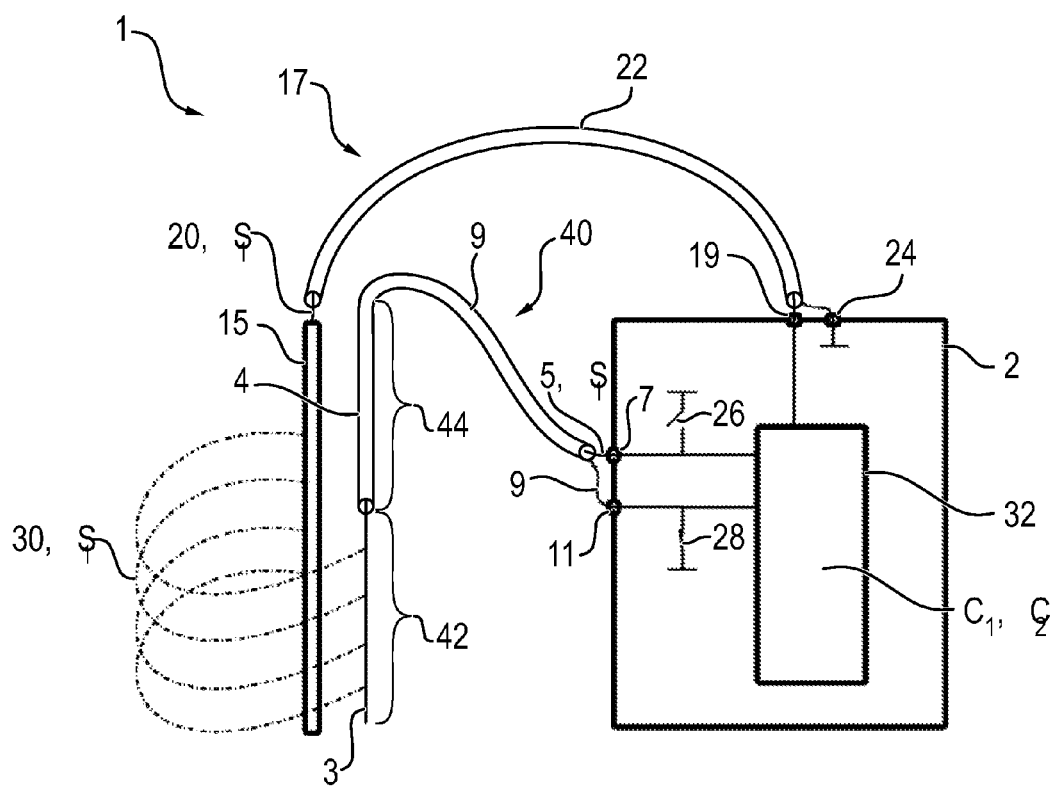
FIG. 3 shows an alternative exemplary embodiment of the sensor in a view according to FIG. 1.

FIG. 3 illustrates an alternative exemplary embodiment of the sensor 1. Here, the first sensor electrode 3 and the second sensor electrode 4 are connected to the first transmitter output 7 and to the second transmitter output 11 respectively via a common coaxial cable 40, that is to say via a common shielded line. Specifically, the first transmission electrode 3 is connected in this case to the first transmitter output 7 via the internal conductor of the coaxial cable 40 which therefore forms the first transmission line 5. The second transmission electrode 4 is connected to the second transmitter output 11 via the shielding conductor of the coaxial cable 40. That is to say, the shielding conductor forms the second transmission line 9.

The first and second transmission electrodes 3 and 4 are each in the form of part of the coaxial cable 40 here. For this purpose, the internal conductor of the coaxial cable 40 is uncovered from the shielding conductor in an end region 42 at the free end. The end region 42 therefore forms the first transmission electrode 3, with the result that the first measurement signal $S_1$ is emitted in the form of the electrical alternating field 30 from the end region 42 of the internal conductor itself in the switching state illustrated. In this case, the electrical alternating field 30 is received by the receiver electrode 15. The second transmission electrode 4 is formed by a section 44 of the shielding conductor, which section adjoins the uncovered end region 42 of the internal conductor in the direction of the evaluation unit 2 (and is oriented parallel to the receiver electrode 15). In the switching state illustrated, the switch 28 of the second transmitter output 11 is closed, with the result that the second transmission electrode 4 is connected to reference potential.

Figure 4:
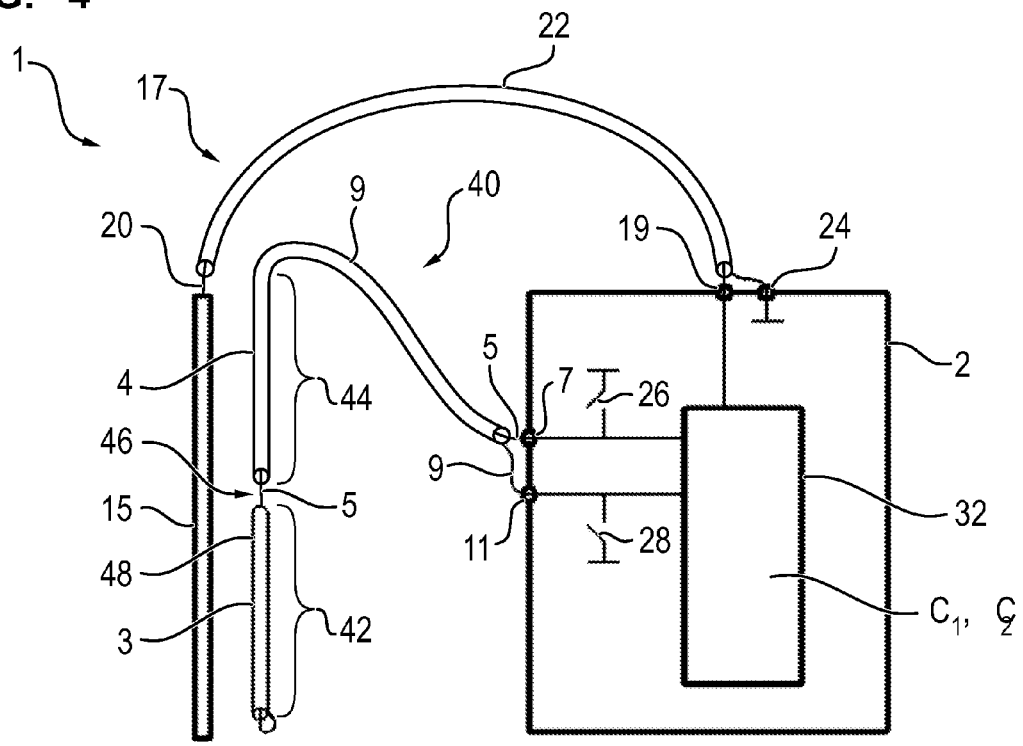
FIG. 4 shows another alternative exemplary embodiment of the sensor in a view according to FIG. 1.

In another exemplary embodiment of the sensor 1, illustrated in FIG. 4, the internal conductor of the coaxial cable 40 is not completely uncovered from the shielding conductor in the end region 42. Rather, an interruption 46 is inserted into the shielding conductor between the section 44 provided as the second transmission electrode 4 and the free end of the coaxial cable 40. That end piece 48 of the shielding conductor which remains on the internal conductor in the end region 42 is therefore electrically decoupled from the second transmitter output 11. However, the end piece 48 of the shielding conductor is in contact with the internal conductor (that is to say with the first transmission line 5), with the result that the separated end piece 48 of the shielding conductor forms the first transmission electrode 3. As a result, the surface area of the first transmission electrode 3 which is effective for emitting the first measurement signal $S_1$ is increased and is matched to the surface area of the second transmission electrode 4.

Figure 5:
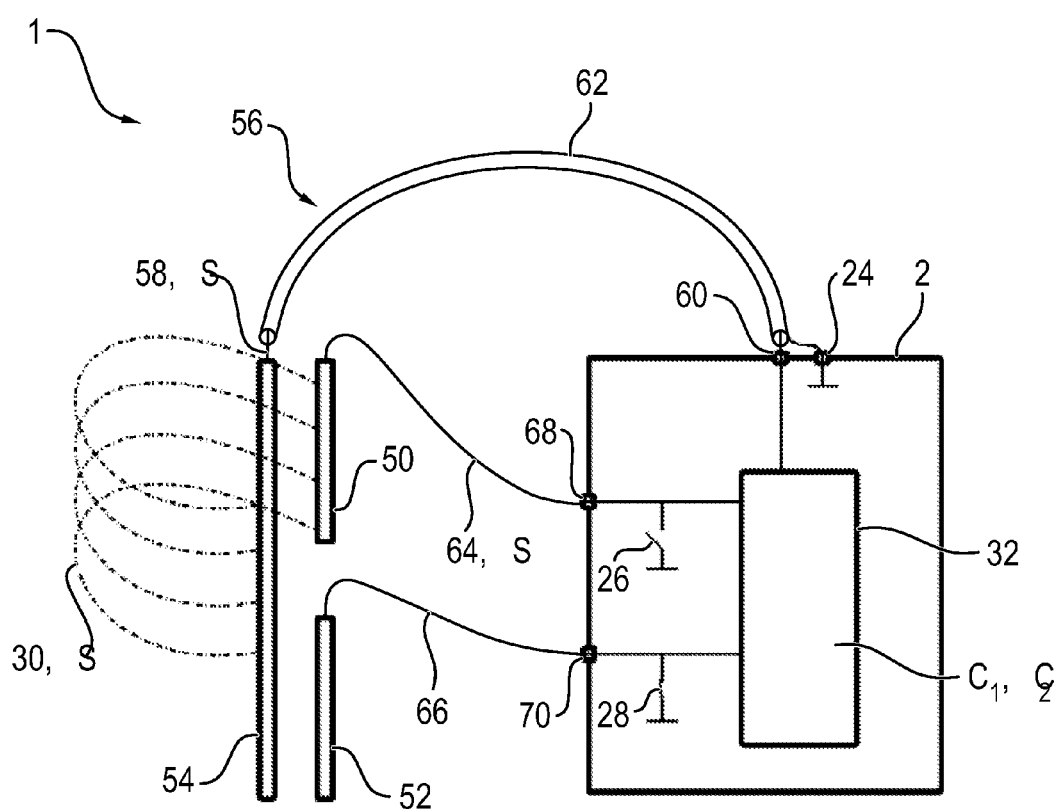
FIG. 5 again shows an alternative exemplary embodiment of the sensor in a view according to FIG. 1, the sensor having a transmission electrode and two receiver electrodes which are separate from one another.

In an alternative exemplary embodiment, illustrated in FIG. 5, the capacitive sensor 1 (instead of the receiver electrode 15) comprises a first and a second receiver electrode 50 and 52 and (instead of the two transmission electrodes 3 and 4) a transmission electrode 54 which is common to both receiver electrodes 50 and 52. The transmission electrode 54 is connected to a transmitter output 60 of the evaluation unit 2 by means of a shielded transmission line 56 in the form of a coaxial cable, specifically by means of its internal conductor 58. The shielding conductor 62 of the transmission line 56 is connected (in a similar manner to the exemplary embodiments of the receiver line 17 according to FIGS. 1 to 4 above) to the potential connection 24. The first and second receiver electrodes 50 and 52 are each connected respectively to a first and a second receiver input 68 and 70 of the evaluation unit 2 via a first and a second unshielded receiver line 64 and 66. In this case, the first switch 26 is assigned to the first receiver input 68 and the second switch 28 is assigned to the second receiver input 70. In the switching state illustrated in FIG. 5, the second switch 28 is closed, with the result that the second receiver input 70 (and therefore the second receiver electrode 52 and the second receiver line 66) is coupled to reference potential. As a result, a measurement signal S emitted by the transmission electrode 54 in the form of the electrical alternating field 30 is received only via the first receiver electrode 50. In addition, interaction of the first and second receiver electrodes 50 and 52 with the associated receiver lines 64 and 66 is prevented.

It will be understood that the subject matter of the invention is not restricted to the exemplary embodiments described above. Rather, further embodiments of the invention can be derived from the description above by a person skilled in the art. In particular, the individual features of the invention described using the different exemplary embodiments and their embodiment variants can also be combined with one another in another manner.

The following is a summary list of reference numerals and the corresponding structure used in the above description of the invention:

1 Sensor
2 Evaluation unit
3 Transmission electrode
4 Transmission electrode
5 Transmission line
7 Transmitter output
9 Transmission line
11 Transmitter output
15 Receiver electrode
17 Receiver line
19 Receiver input
20 Internal conductor
22 Shielding conductor
24 Potential connection
26 Switch
28 Switch
30 Alternating field
32 Signal processing unit
40 Coaxial cable
42 End region
44 Section
46 Interruption
48 End piece
50 Receiver electrode
52 Receiver electrode
54 Transmission electrode
56 Transmission line
58 Internal conductor
60 Transmitter output
62 Shielding conductor
64 Receiver line
66 Receiver line
68 Receiver input
70 Receiver input
S Measurement signal
$S_1$ Measurement signal
$S_2$ Measurement signal $C_1$ Sensor capacitance
$C_2$ Sensor capacitance

The invention claimed is:

1. A capacitive sensor for a vehicle, comprising:
an evaluation unit with a first transmitter output and a second transmitter output;
a first transmission electrode for transmitting a first measurement signal, said first transmission electrode being connected to said first transmitter output of said evaluation unit by way of a first transmission line; and
a second transmission electrode for transmitting a second measurement signal, said second transmission electrode being connected to said second transmitter output of said evaluation unit by way of a second transmission line;
said evaluation unit being configured to alternately output the first measurement signal via said first transmitter output and the second measurement signal via said second transmitter output, and to connect the respective non-transmitting second transmitter output or first transmitter output to reference potential; and
a shielded conductor having an internal line forming said first transmission line and a shielding conductor forming said second transmission line, said shielded conductor having an end region where a free end of said internal conductor is uncovered from said shielding conductor, the uncovered end region of said internal conductor forming said first transmission electrode, and an end of said shielding conductor forming said second transmission electrode.

2. The capacitive sensor according to claim 1, further comprising a receiver electrode for receiving the first measurement signal and the second measurement signal, said receiver electrode being connected to a receiver input of the evaluation unit by way of a shielded receiver line.

3. A capacitive sensor for a vehicle, comprising:
an evaluation unit with a first transmitter output and a second transmitter output;
a first transmission electrode for transmitting a first measurement signal, said first transmission electrode being connected to said first transmitter output of said evaluation unit by way of a first transmission line; and
a second transmission electrode for transmitting a second measurement signal, said second transmission electrode being connected to said second transmitter output of said evaluation unit by way of a second transmission line;
said evaluation unit being configured to alternately output the first measurement signal via said first transmitter output and the second measurement signal via said second transmitter output, and to connect the respective non-transmitting second transmitter output or first transmitter output to reference potential;
a shielded conductor having an internal line forming said first transmission line and a shielding conductor forming said second transmission line;
wherein said shielding conductor is interrupted between said evaluation unit and a free end of said shielded conductor, and an end piece of said shielding conductor is in contact with the internal conductor, wherein the end piece of said shielding conductor forms said first transmission electrode, and the free end of a region of said shielding conductor that is connected to said second transmitter output forms said second transmission electrode.

4. A capacitive sensor, comprising:
an evaluation unit having a first receiver input and a second receiver input;
a transmission electrode for emitting a measurement signal;
a first receiver electrode connected to said first receiver input of said evaluation unit by way of a first receiver line; and
a second receiver electrode connected to said second receiver input of said evaluation unit by way of a second receiver line;
said evaluation unit being configured to alternately receive the measurement signal via said first receiver input and via said second receiver input, and to connect the respectively inactive second receiver input or first receiver input to reference potential; and
a shielded conductor having an internal line forming said first receiver line and a shielding conductor forming said second receiver line, said shielded conductor having an end region where a free end of said internal conductor is uncovered from said shielding conductor, the uncovered end region of said internal conductor forming said first receiver electrode, and an end of said shielding conductor forming said second receiver electrode.

5. A capacitive sensor, comprising:
an evaluation unit having a first receiver input and a second receiver input;
a transmission electrode for emitting a measurement signal;
a first receiver electrode connected to said first receiver input of said evaluation unit by way of a first receiver line; and
a second receiver electrode connected to said second receiver input of said evaluation unit by way of a second receiver line;
said evaluation unit being configured to alternately receive the measurement signal via said first receiver input and via said second receiver input, and to connect the respectively inactive second receiver input or first receiver input to reference potential;
a shielded conductor having an internal line forming said first receiver line and a shielding conductor forming said second receiver line, said shielding conductor being interrupted between said evaluation unit and a free end of said shielded conductor, and an end piece of said shielding conductor being in contact with the internal conductor; and
wherein the end piece of said shielding conductor forms said first receiver electrode, and the free end of a region of said shielding conductor that is connected to said second receiver output forms said second receiver electrode.

* * * * *